(12) United States Patent
Hakewill et al.

(10) Patent No.: US 6,560,754 B1
(45) Date of Patent: May 6, 2003

(54) METHOD AND APPARATUS FOR JUMP CONTROL IN A PIPELINED PROCESSOR

(75) Inventors: James Robert Howard Hakewill, Herts (GB); John Sanders, Middlesex (GB)

(73) Assignee: ARC International PLC, Herts (GB)

( * ) Notice: Subject to any disclaimer, the term of this patent is extended or adjusted under 35 U.S.C. 154(b) by 0 days.

(21) Appl. No.: 09/523,871

(22) Filed: Mar. 13, 2000

Related U.S. Application Data

(60) Provisional application No. 60/134,253, filed on May 13, 1999.

(51) Int. Cl.[7] ............................................. G06F 17/50
(52) U.S. Cl. ................................... 716/4; 716/1; 716/5
(58) Field of Search .......................... 716/2, 4, 18, 5, 716/1; 712/221, 226, 233, 234, 216

(56) References Cited

U.S. PATENT DOCUMENTS

| | | | |
|---|---|---|---|
| 5,488,730 A | * | 1/1996 | Brown et al. ............... 712/217 |
| 5,491,640 A | | 2/1996 | Sharma et al. |
| 5,493,508 A | | 2/1996 | Dangelo et al. |
| 5,502,661 A | | 3/1996 | Glunz |
| 5,537,580 A | | 7/1996 | Giorni et al. |
| 5,544,067 A | | 8/1996 | Rostoker et al. |
| 5,555,201 A | | 9/1996 | Dangelo et al. |
| 5,751,984 A | * | 5/1998 | Chang et al. ............... 712/216 |
| 5,801,958 A | | 9/1998 | Dangelo et al. |
| 5,812,416 A | | 9/1998 | Gupte et al. |
| 5,841,663 A | | 11/1998 | Sharma et al. |
| 5,854,930 A | | 12/1998 | McLain et al. |
| 5,898,595 A | | 4/1999 | Bair et al. |
| 6,016,543 A | * | 1/2000 | Suzuki et al. ............... 712/216 |
| 6,026,219 A | | 2/2000 | Miller et al. |
| 6,110,223 A | | 8/2000 | Southgate et al. |
| 6,338,136 B1 | * | 1/2002 | Col et al. ................... 711/102 |

FOREIGN PATENT DOCUMENTS

| | | |
|---|---|---|
| EP | 0365188 A | 4/1990 |
| WO | WO 97 13209 A | 4/1997 |

OTHER PUBLICATIONS

Elms, A., "Tuning a Customisable RISC Core for DSP," Electronic Product Design, Sep. 1997, vol. 18, No. 9, pp. 19–20, 22, XP000909039.

Berekovic, Mladen, et al., A Core Generator for Fully Synthesizable and Highly Parameterizable RISC–Cores for System–On–Chip Designs, 1998 IEEE Workshop on Signal Processing Systems, pp. 561–568, XP–002137267.

Yang, Jin–Hyuk, et al., "MetaC ore: A Configurable & Instruction–Level Extensible DSP Core, " Proceedings of the ASP–DAC '98 Asian and South Pacific Design Automation Conference 1998, pp. 325–326, XP –002137268.

(List continued on next page.)

*Primary Examiner*—Matthew Smith
*Assistant Examiner*—Paul Dinh
(74) *Attorney, Agent, or Firm*—Gazdzinski & Associates

(57) ABSTRACT

An improved method and apparatus for controlling and implementing instructions in a pipelined central processing unit (CPU) or user-customizable microprocessor. In a first aspect of the invention, an improved method of permitting programmer control of jump instruction interlocks is disclosed. In one embodiment, a minimum of one cycle is required between an instruction that sets flags and a branch taken as a result of those flags; an interlock is used to detect a branch preceded by an instruction setting the flags to ensure that the instruction immediately preceding the branch can not affect the branch outcome. In a second embodiment, a jump instruction following a flag setting instruction whose flags may affect the outcome of the jump is stalled until all flags are set. In a second aspect of the invention, a method of synthesizing a processor design incorporating the aforementioned interlocks is disclosed. Exemplary gate logic synthesized using the aforementioned methods, and a computer system capable of implementing these methods, are also described.

10 Claims, 10 Drawing Sheets

OTHER PUBLICATIONS

Application Ser. No. 09/418,663 entitled "Method and Apparatus for Managing the Configuration and Functionality of a Semiconductor Design," filed Oct. 14, 1999—Attorney Docket No. ARC.001A.

Application Ser. No. 09/523,877 entitled "Method and Apparatus for Jump Delay Slot Control In a Pipelined Processor," filed Mar. 13, 2000—Attorney Docket No. ARC.005A.

Application Ser. No. 09/524,179 entitled "Method and Apparatus for Processor Pipeline Segmentation and Re–Assembly," filed Mar. 13, 2000—Attorney Docket No. ARC.007A.

Application Ser. No. 09/524,178 entitled "Method and Apparatus for Loose Register Encoding Within a Pipelined Processor," filed Mar. 13, 2000—Attorney Docket No. ARC.008A.

Warren, H.S., "Instruction Scheduling for the IBM RISC System/6000 Processor," IBM Journal of Research and Development, vol. 34, No. 1, (1990) pp. 85–92, XP000128183.

"Condition Register Coherency Look–Ahead," Research Disclosure (1993), No. 348, p. 243, XP000304185.

Ditzel, D.R., et al., "Branch Folding in the CRISP Microprocessor: Reducing Branch Delay to Zero," $14^{th}$ Annual International Symposium on Computer Architecture, (1987), pp. 2–8, XP000212073.

* cited by examiner

|  | INSTRUCTION CYCLE | | | | | | | |
|---|---|---|---|---|---|---|---|---|
|  | 1 | 2 | 3 | 4 | 5 | 6 | 7 | 8 | ... |
| INST. FETCH | B | I | - | - | $X_1$ | $X_2$ | $X_3$ | $X_4$ | ... |
| DECODE |  | B | - | - |  | $X_1$ | $X_2$ | $X_3$ | ... |
| DATA R/W |  |  | B | - | - |  | $X_1$ | $X_2$ | ... |
| EXECUTE |  |  |  | B | NOP | NOP | NOP | $X_1$ | ... |

FIG. 2
PRIOR ART

METHOD AND APPARATUS FOR JUMP CONTROL IN A PIPELINED PROCESSOR

This application claims priority to U.S. Provisional Patent Application Ser. No. 60/134,253 filed May 13, 1999, entitled "Method And Apparatus For Synthesizing And Implementing Integrated Circuit Designs".

COPYRIGHT

A portion of the disclosure of this patent document contains material that is subject to copyright protection. The copyright owner has no objection to the facsimile reproduction by anyone of the patent document or the patent disclosure, as it appears in the Patent and Trademark Office patent files or records, but otherwise reserves all copyright rights whatsoever.

RELATED APPLICATIONS

This application is related to co-pending U.S. patent application Ser. No. 09/523,877 filed Mar. 13, 2000 and entitled "Method and Apparatus for Jump Delay Slot Control in a Pipelined Processor", U.S. patent application Ser. No. 09/524,179 filed Mar. 13, 2000 and entitled "Method and Apparatus for Processor Pipeline Segmentation and Re-Assembly", U.S. patent application Ser. No. 09/524,178 filed Mar. 13, 2000 and entitled "Method and Apparatus for Loose Register Encoding Within a Pipelined Processor", and U.S. patent application Ser. No. 09/418,663 filed Oct. 14, 1999, entitled "Method and Apparatus for Managing the Configuration and Functionality of a Semiconductor Design".

BACKGROUND OF THE INVENTION

1. Field of the Invention

The present invention relates to the field of integrated circuit design, specifically to the use of a hardware description language (RDL) for implementing instructions in a pipelined central processing unit (CPU) or user-customizable microprocessor.

2. Description of Related Technology

RISC (or reduced instruction set computer) processors are well known in the computing arts. RISC processors generally have the fundamental characteristic of utilizing a substantially reduced instruction set as compared to non-RISC (commonly known as "CISC") processors. Typically, RISC processor machine instructions are not all micro-coded, but rather may be executed immediately without decoding, thereby affording significant economies in terms of processing speed. This "streamlined" instruction handling capability furthermore allows greater simplicity in the design of the processor (as compared to non-RISC devices), thereby allowing smaller silicon and reduced cost of fabrication.

RISC processors are also typically characterized by (i) load/store memory architecture (i.e., only the load and store instructions have access to memory; other instructions operate via internal registers within the processor); (ii) unity of processor and compiler; and (iii) pipelining.

Pipelining is a technique for increasing the performance of processor by dividing the sequence of operations within the processor into segments which are effectively executed in parallel when possible. In the typical pipelined processor, the arithmetic units associated with processor arithmetic operations (such as ADD, MULTIPLY, DIVIDE, etc.) are usually "segmented", so that a specific portion of the operation is performed in a given segment of the unit during any clock cycle. FIG. 1 illustrates a typical processor architecture having such segmented arithmetic units. Hence, these units can operate on the results of a different calculation at any given clock cycle. As an example, in the first clock cycle two numbers A and B are fed to the multiplier unit 10 and partially processed by the first segment 12 of the unit. In the second clock cycle, the partial results from multiplying A and B are passed to the second segment 14 while the first segment 12 receives two new numbers (say C and D) to start processing. The net result is that after an initial startup period, one multiplication operation is performed by the arithmetic unit 10 every clock cycle.

The depth of the pipeline may vary from one architecture to another. In the present context, the term "depth" refers to the number of discrete stages present in the pipeline. In general, a pipeline with more stages executes programs faster but may be more difficult to program if the pipeline effects are visible to the programmer. Most pipelined processors are either three stage (instruction fetch, decode, and execute) or four stages (such as instruction fetch, decode, operand fetch, and execute, or alternatively instruction fetch, decode/operand fetch, execute, and writeback), although more or less stages may be used.

When developing the instruction set of a pipelined processor, several different types of "hazards" must be considered. For example, so called "structural" or "resource contention" hazards arise from overlapping instructions competing for the same resources (such as busses, registers, or other functional units) which are typically resolved using one or more pipeline stalls. So-called "data" pipeline hazards occur in the case of read/write conflicts which may change the order of memory or register accesses. "Control" hazards are generally produced by branches or similar changes in program flow.

Interlocks are generally necessary with pipelined architectures to address many of these hazards. For example, consider the case where a following instruction (n+1) in an earlier pipeline stage needs the result of the instruction n from a later stage. A simple solution to the aforementioned problem is to delay the operand calculation in the instruction decoding phase by one or more clock cycles. A result of such delay, however is that the execution time of a given instruction on the processor is in part determined by the instructions surrounding it within the pipeline. This complicates optimization of the code for the processor, since it is often difficult for the programmer to spot interlock situations within the code.

"Scoreboarding" may be used in the processor to implement interlocks; in this approach, a bit is attached to each processor register to act as an indicator of the register content; specifically, whether (i) the contents of the register have been updated and are therefore ready for use, or (ii) the contents are undergoing modification such as being written to by another process. This scoreboard is also used in some architectures to generate interlocks which prevent instructions which are dependent upon the contents of the scoreboarded register from executing until the scoreboard indicates that the register is ready. This type of approach is referred to as "hardware" interlocking, since the interlock is invoked purely through examination of the scoreboard via hardware within the processor. Such interlocks generate "stalls" which preclude the data dependent instruction from executing (thereby stalling the pipeline) until the register is ready.

Alternatively, NOPs (no-operation opcodes) may be inserted in the code so as to delay the appropriate pipeline stage when desired. This later approach has been referred to as "software" interlocking, and has the disadvantage of increasing the code size and complexity of programs that employ instructions that require interlocking. Heavily software interlocked designs also tend not to be fully optimized in terms of their code structures.

Another important consideration in processor design is program branching or "jumps". All processors support some type of branching instructions. Simply stated, branching refers to the condition where program flow is interrupted or altered. Other operations such as loop setup and subroutine call instructions also interrupt or alter program flow in a similar fashion. The term "jump delay slot" is often used to refer to the slot within a pipeline subsequent to a branching or jump instruction being decoded. The instruction after the branch (or load) is executed while awaiting completion of the branch/load instruction. Branching may be conditional (i.e., based on the truth or value of one or more parameters) or unconditional. It may also be absolute (e.g., based on an absolute memory address), or relative (e.g., based on relative addresses and independent of any particular memory address).

Branching can have a profound effect on pipelined systems. By the time a branch instruction is inserted and decoded by the processor's instruction decode stage (indicating that the processor must begin executing a different address), the next instruction word in the instruction sequence has been fetched and inserted into the pipeline. One solution to this problem is to purge the fetched instruction word and halt or stall further fetch operations until the branch instruction has been executed, as illustrated in FIG. 2. This approach, however, by necessity results in the execution of the branch instruction in several instruction cycles, this number typically being between one and the depth of the pipeline employed in the processor design. This result is deleterious to processor speed and efficiency, since other operations can not be conducted by the processor during this period.

Alternatively, a delayed branch approach may be employed. In this approach, the pipeline is not purged when a branch instruction reaches the decode stage, but rather subsequent instructions present in the earlier stages of the pipeline are executed normally before the branch is executed. Hence, the branch appears to be delayed by the number of instruction cycles necessary to execute all subsequent instructions in the pipeline at the time the branch instruction is decoded. This approach increases the efficiency of the pipeline as compared to multi-cycle branching described above, yet also complexity (and ease of understanding by the programmer) of the underlying code.

Based on the foregoing, processor designers and programmers must carefully weigh the tradeoffs associated with utilizing hardware or software interlocks as opposed to a non-interlock architecture. Furthermore, the interaction of branching instructions (and delayed or multi-cycle branching) in the instruction set with the selected interlock scheme must be considered. What is needed is an improved approach to pipeline interlocking which optimizes processor pipeline performance and provides attributes of both hardware and software interlocks, while providing the programmer with additional flexibility of coding. Furthermore, as more pipeline stages (and even multiple multi-stage pipelines) are added to processor designs, the benefits of enhanced interlock performance and code optimization within the processor increase manifold. Additionally, the ability to readily synthesize such improved pipelined processor designs in an application-specific manner, and using available synthesis tools, is of significant utility to the designer and programmer.

SUMMARY OF THE INVENTION

The present invention satisfies the aforementioned needs by providing an improved method and apparatus for executing instructions within a pipelined processor architecture.

In a first aspect of the invention, an improved method of controlling jumping with the CPU is disclosed. In a first embodiment, a pipeline interlock mode is provided whereby the relationship between an instruction which sets branch flags and a subsequent branch is detected; such instructions immediately preceding the branch within a predetermined increment are prevented from affecting the branch, thereby permitting a flag-setting instruction to be scheduled into the slot immediately preceding the branch. A NOP (non-operation) may be used to occupy the slot preceding the branch. In a second embodiment, the NOP is obviated through a mode having a code structure which requires that a branch at an earlier stage of the pipeline be delayed until the flag-setting instruction has moved out of a later stage of the pipeline, and the flags have been set.

In a second aspect of the invention, an improved method of synthesizing the design of an integrated circuit incorporating the aforementioned jump delay slot method is disclosed. In one exemplary embodiment, the method comprises obtaining user input regarding the design configuration; creating customized HDL functional blocks based on the user's input and existing library of functions; determining the design hierarchy based on the user's input and the library and generating a hierarchy file, new library file, and makefile; running the makefile to create the structural HDL and scripts; running the generated scripts to create a makefile for the simulator and a synthesis script; and synthesizing the design based on the generated design and synthesis script.

In a third aspect of the invention, an improved computer program useful for synthesizing processor designs and embodying the aforementioned method is disclosed. In one exemplary embodiment, the computer program comprises an object code representation stored on the magnetic storage device of a microcomputer, and adapted to run on the central processing unit thereof. The computer program further comprises an interactive, menu-driven graphical user interface (GUI), thereby facilitating ease of use.

In a fourth aspect of the invention, an improved apparatus for running the aforementioned computer program used for synthesizing logic associated with pipelined processors is disclosed. In one exemplary embodiment, the system comprises a stand-alone microcomputer system having a display, central processing unit, data storage device(s), and input device.

In a fifth aspect of the invention, an improved processor architecture utilizing the foregoing jump interlock methodology and constrained/unconstrained synthesized logic is disclosed. In one exemplary embodiment, the processor comprises a reduced instruction set computer (RISC) having an at least three stage pipeline comprising instruction fetch, decode, and execute stages which are controlled in part by the aforementioned jump interlock methodology.

BRIEF DESCRIPTION OF THE DRAWINGS

FIG. 2 illustrates graphically the operation of a prior art four stage pipelined processor undergoing a multi-cycle branch operation.

DETAILED DESCRIPTION OF THE INVENTION

Figure 1:
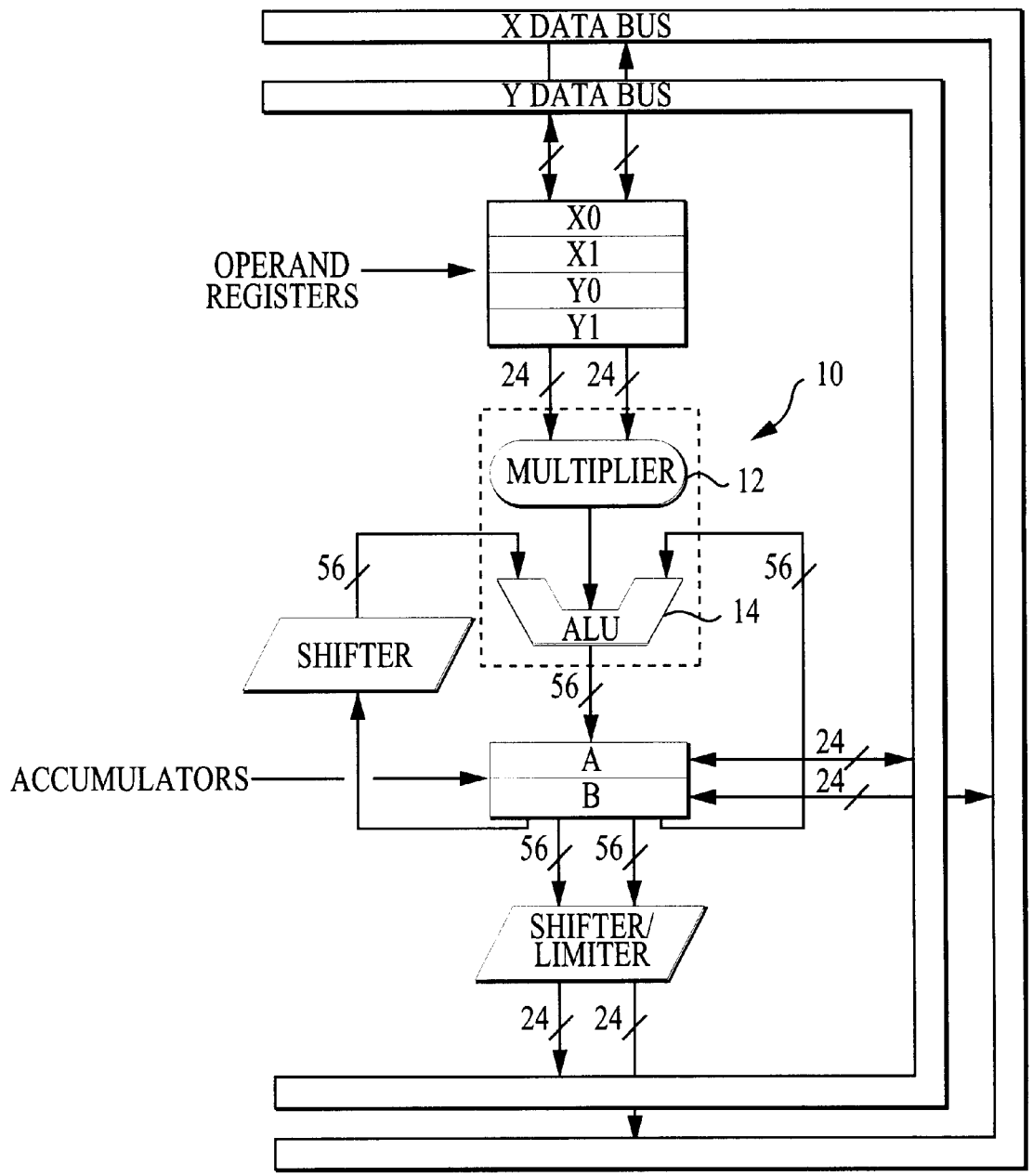
FIG. 1 is block diagram of a typical prior art processor architecture employing "segmented" arithmetic units.

Reference is now made to the drawings wherein like numerals refer to like parts throughout.

As used herein, the term "processor" is meant to include any integrated circuit or other electronic device capable of performing an operation on at least one instruction word including, without limitation, reduced instruction set core (RISC) processors such as the ARC user-configurable core manufactured by the Assignee hereof, central processing units (CPUs), and digital signal processors (DSPs). The hardware of such devices may be integrated onto a single piece of silicon ("die"), or distributed among two or more die. Furthermore, various functional aspects of the processor may be implemented solely as software or firmware associated with the processor.

Additionally, it will be recognized by those of ordinary skill in the art that the term "stage" as used herein refers to various successive stages within a pipelined processor; i.e., stage 1 refers to the first pipelined stage, stage 2 to the second pipelined stage, and so forth.

It is also noted that while the following description is cast in terms of VHSIC hardware description language (VHDL), other hardware description languages such as Verilog® may be used to describe various embodiments of the invention with equal success. Furthermore, while an exemplary Synopsys® synthesis engine such as the Design Compiler 1999.05 (DC99) is used to synthesize the various embodiments set forth herein, other synthesis engines such as Buildgates® available from, inter alia, Cadence Design Systems, Inc., may be used. IEEE std. 1076.3–1997, IEEE Standard VHDL Synthesis Packages, describe an industry-accepted language for specifying a Hardware Definition Language-based design and the synthesis capabilities that may be expected to be available to one of ordinary skill in the art.

Lastly, it will be recognized that while the following description illustrates specific embodiments of logic synthesized by the Assignee hereof using the aforementioned synthesis engine and VHSIC hardware description language, such specific embodiments being constrained in different ways, these embodiments are only exemplary and illustrative of the design process of the present invention. Furthermore, while a 1.0 um process was specified for these embodiments, other fabrication processes (such as 0.35 um or 0.18 um) may conceivably be used in conjunction with the invention disclosed herein.

The improved method of controlling jumping (including branching, loop setup, subroutine calls, etc.) within a processor according to the present invention is now described.

The method of the present invention generally comprises constructing one or more interlocks between an instruction word within the instruction set of the processor which sets a flag and a jump (instruction) taken as a result of that flag. In one embodiment described with respect to FIG. 3 below, flag setting instructions preceding a given jump instruction by a predetermined number of cycles are prohibited from affecting the execution of that jump. For example, a minimum number of cycles (n) are required between a flag setting instruction and any jump taken as a result of the flags set by that instruction. In another embodiment (FIG. 6), the jump instruction at a first stage is delayed until the flag setting instruction at a later stage is moved out of that stage. It is assumed for purposes of illustration that the processor architecture executes one instruction per machine cycle, although it will be appreciated that other architectures may be used.

Consider a pipelined architecture where a jump instruction can be conditional on a processor flag, and the jump instruction is executed in an earlier pipeline stage than an instruction that can set the flag. It would be possible to execute a flag setting instruction at the same time as a conditional jump, since the two instructions can be at different stages in the pipeline at the same time. Assuming that the processor flags are updated at the end of each cycle, the conditional jump would determine whether to change program flow based on the value of the flag at the beginning of the cycle, rather than the value of the flag which has been calculated during the cycle by the flag-setting instruction. Thus the jump instruction will not be affected by the result of the flag-setting instruction.

In order to ensure that the jump instruction will use the flag value set by the flag-setting instruction, the jump instruction cannot be executed until the flag value has been updated. A number (n) of cycles are therefore required between the execution of the flag-setting instruction and the execution of the jump instruction.

However, if the jump instruction was stalled in the pipeline for some reason, and the flag-setting instruction in a later pipeline stage unaffected, by the stall was allowed to complete and update the processor flag, then when the jump was allowed to continue, it would be conditional on the updated processor flag and a different result could be obtained.

The skillful programmer will want to ensure that useful instructions can be executed in the required period between the flag-setting instruction and the jump instruction. Without the invention described here, the programmer would have to ensure that any instruction placed between the flag-setting instruction and the jump instruction would never alter the value of the processor flag being tested by the jump instruction.

The improved method and apparatus described herein allows the programmer to schedule a second flag-setting instruction in the required period between a first flag-setting instruction and its corresponding conditional jump, and be sure that the conditional jump would not be affected by the second flag-setting instruction if the jump were stalled in the pipeline. This would, for example, allow a second conditional jump instruction to be paired with the second flag-setting instruction, in such a way that the two pairs of instructions can be made to 'overlap', thus saving execution time.

Figure 3:
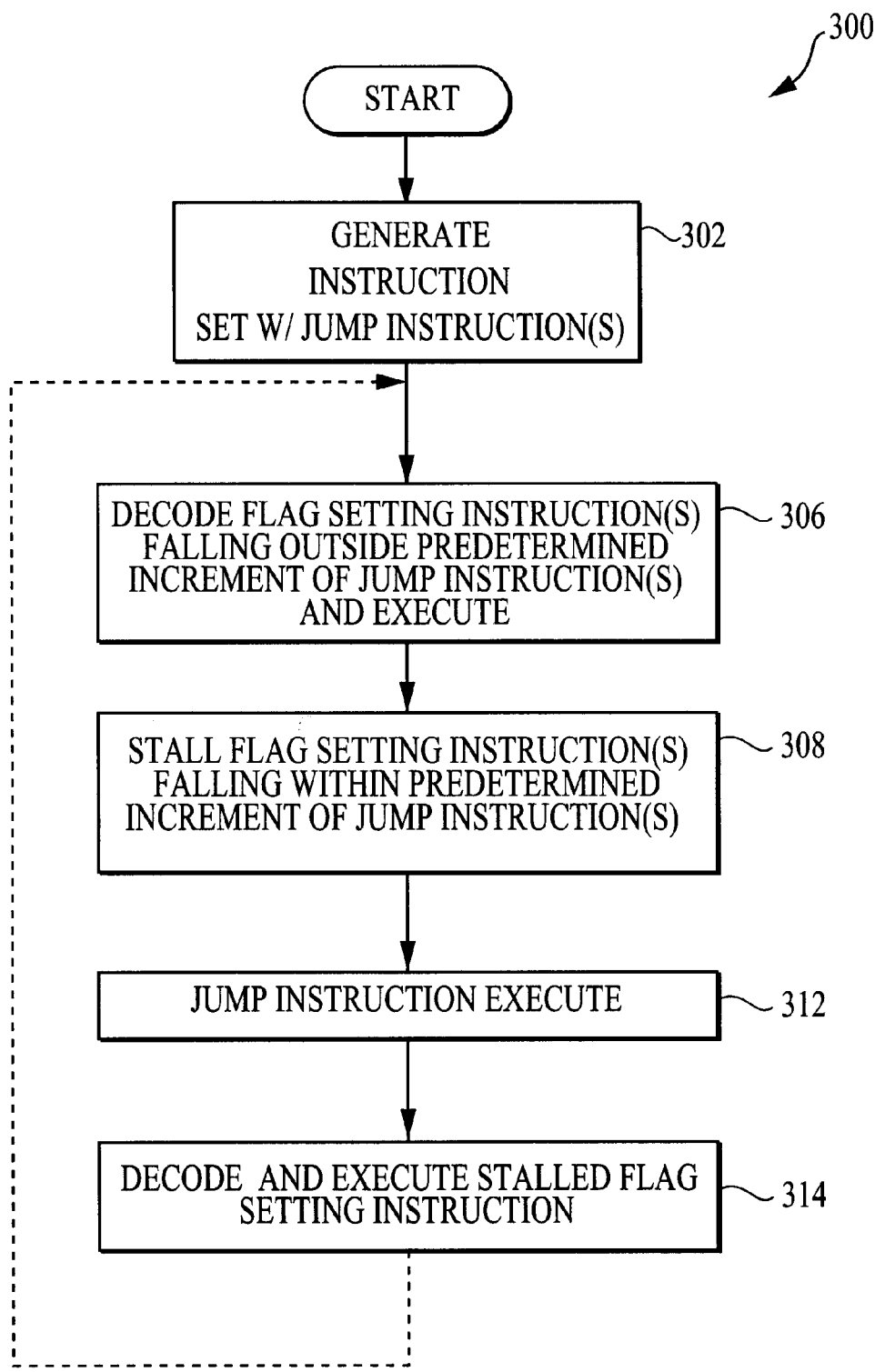
FIG. 3 is a logical flow diagram illustrating the generalized methodology of controlling branching within a pipelined processor via a first interlock mode according to the present invention.

Referring now to FIG. 3, a first embodiment of the generalized method of controlling jumping within a pipelined processor according to the present invention is described. In a first step 302 of the method 300, a program adapted to run on the processor and comprising a plurality of instruction words is provided. Each instruction word in the program is represented by and comprises a plurality of data bits, and at least one of the instruction words comprises a flag setting instruction (such as the "xor.f" instruction discussed in greater detail below), and at least one other word comprises a jump instruction. It is noted however that as usedherein, the term "jump" may refer to any branch, jump, loop setup, or call instructions, although other instructions requiring a change in the flow of the instruction processing of the processor may conceivably be used in conjunction with the disclosed invention. The form and content of both flag setting and jump instructions are generally well known in the digital processor arts.

The flag setting instruction word(s) may be in any order or relationship to the jump instruction word(s); however, it is the case that at least one flag setting word will precede at least one jump instruction word within the program. The relative proximity of this preceding flag setting word to a following jump instruction word (as measured by the number of machine or processor cycles corresponding to instruction words in the program sequence) may also vary. Under the prior art approach, when the flag setting word precedes the jump instruction by less than a predetermined increment or number instruction words in the program sequence, the operation of the jump instruction may be affected by flags set by the flag-setting instruction immediately preceding it. Accordingly, the operation of the jump may vary dependent upon whether or not a flag setting instruction is scheduled into the slot(s) preceding the jump; this behavior needs to be explicitly considered by the device programmer.

In contrast, the interlock feature of the present embodiment precludes a flag setting instruction which occurs less than a predetermined increment before a jump instruction from affecting the operation of that jump. Specifically, in the illustrated embodiment, the increment comprises one machine cycle, and accordingly any flags set within the arithmetic logic unit (ALU) or other units within the processor within the cycle or slot immediately preceding the jump cannot set the flags before the jump instruction has completed, and thus it can not change the flags (such as those of the ALU) which the jump will consider As a general proposition, the interlock signal of the illustrated embodiment is not set true (i.e., the interlock is not enabled) when a load is in stage 3 to prevent a possible lockup situation between a jump instruction (e.g., "Jcc rn") in stage 2, and a load instruction (e.g., "LD rn, [ . . . ]") in stage 3. In this case, the scoreboard could prevent the load from completing, which would mean that the scoreboard would never be cleared, resulting in a complete deadlock situation. Such exclusion of loads is not considered problematic with respect to the present invention since loads cannot set the flags.

In step 306, the flag setting instruction(s) occurring before one instruction prior to the jump instruction is decoded and executed, thereby setting the designated flags within the ALU or other registers within the processor. It is noted that in the present embodiment, a jump instruction in stage 2 and a flag-setting instruction in stage 3 must be decoded before the relationship between them can be analyzed.

Next, in step 308, the processor pipeline has moved on from step 306, and the logic has analyzed the relationship between any jump and flag setting instructions present in the pipeline. The interlock has determined that a flag setting instruction is present in pipeline stage 3, immediately preceding a jump instruction present at stage 2. The jump instruction is to be stalled at the end of present cycle, since a stall-request signal for stage 2 is set true. In order to prevent the flag setting instruction from affecting the subsequent jump, the flag setting instruction must also stalled at the end of the present cycle. The interlock generates a stall request signal for stage 3. At the end of the cycle, the stall-request signals prevent the instructions in stage 2 and 3 from moving to the next stage in the pipeline.

In step 312, the at least one jump instruction scheduled after the flag setting instruction is decoded and executed by the processor at some later time when the stage 2 stall is removed, and the designated jump taken. Methods and apparatus useful for instruction decoding are well known in the computer arts, and accordingly will not be described further herein.

In step 314, the stalled (second) flag setting instruction is decoded and executed at the same time as completion of the jump of step 312. The simultaneous completion ensures that the second flag setting instruction does not affect the outcome of the jump.

The following example of the method of FIG. 3, (specifically in the context of Version 5 or "v5" of Applicant's ARC Core) is provided for illustration. As previously described, a minimum of one cycle is required between an instruction that sets the flags and a branch taken as a result of those flags; this allows an instruction which sets flags to be scheduled in the pre-branch slot which cannot affect the branch outcome as follows:

| xor.f | 0,r1,−1 | ; set flags for jz instruction |
| and.f | r0,r1,r2 | ; does not affect branch outcome |
| jz | [r10] | ; take jump |

Often times this slot will be filled with a NOP (non-operation) instruction as illustrated in the following example:

| xor.f | 0,r0,−2 | ; test if r0 is −2 |
| nop | | ; leave a blank slot ("padding") |
| bz | r0__is__minus__2 | ; take branch |

The v5 interlock is designed to ensure that when the second flag-setting instruction reaches stage 3, it cannot set the flags before the branch instruction has completed, and thus it can not change the flags (such as those of the ALU) which the branch will consider. In the foregoing example, the interlock detects the cases when this may occur, and stalls the flag setting instruction in stage 3.

The v5 interlock signal ("ibch_holdp3") of the illustrated embodiment further considers three types of stage 2 stall which can affect a jump;
  i. The following instruction is not present
  ii. A jump (e.g., Jcc [rn]) is referencing a scoreboarded register
  iii. A jump (e.g., Jcc [rn]) is held up by an extension stage 2 stall
  i. In the ARC v5 processor, the instruction immediately following a jump instruction is referred to as the 'delay slot' instruction. The jump instruction features modes to control the execution of the delay slot instruction depending on the outcome of the branch. In order for the exedution of the following instruction to be controlled, it must be in the pipeline. Jump instructions cans be stalled at stage 2 if the following instruction word is not available to be placed into stage 1, for example as a result of a cache 'miss'.
  ii. If the target address for a jump is to be obtained from a register which is marked as the destination of an uncompleted load (a scoreboarded register), the jump must be stalled until the load has completed, and the register value updated.
  iii. In the ARC v5 processor, an interface is provided for adding additional 'extension' registers. The interface allows an external stall signal to be generated. An external stall might stalling jump instruction at stage 2 if an extension register was referenced by the jump instruction and the extension register was not able to return data on that cycle.

A summary VHDL representation of the foregoing "ibch_holdp3" interlock functionality is as follows:

```
ibch_holdp3    <=    '1'    WHEN ip2bch = '1'
                            AND imload3 = '0'
                            AND ( (holdup12 OR ihp2_1d_nsc) = '1'
                              OR xholdup12 = '1'
                              OR ivalid = '0'   )   ELSE
                            '0';
```

Note that the logic associated with the ibch_holdp3 will stall any instruction at stage 3 if a jump in stage 2 is stalled, unless the instruction at stage 3 is a load. In the present embodiment, the logic does not specifically check for a flag-setting instruction, just an instruction which may set the flags.

Appendix A hereto provides an exemplary VHDL representation used to synthesize the jump pipeline interlock of Version 5 (v5) of the ARC core.

It is noted that besides the aforementioned NOP scheduled into the pre-blanch slot, a skillful programmer may structure their code so as to perform some useful operation in this slot. The alternatives for such code are extensive, and depend upon the overall structure of the program as a whole. For example, in one instance it is possible to perform in the pre-branch slot the first logical operation of the code in the branch. This permits the pre-branch slot to be used for useful program execution. As another example, some algorithms may be partitioned so that the next instruction executed in both branches of the program flow is the same. In this case it is possible to code the instruction in the pre-branch slot so that it is executed regardless of whether or not the branch is taken. Many such alternatives are possible, and considered to fall within the scope of the invention disclosed herein.

Figure 4:
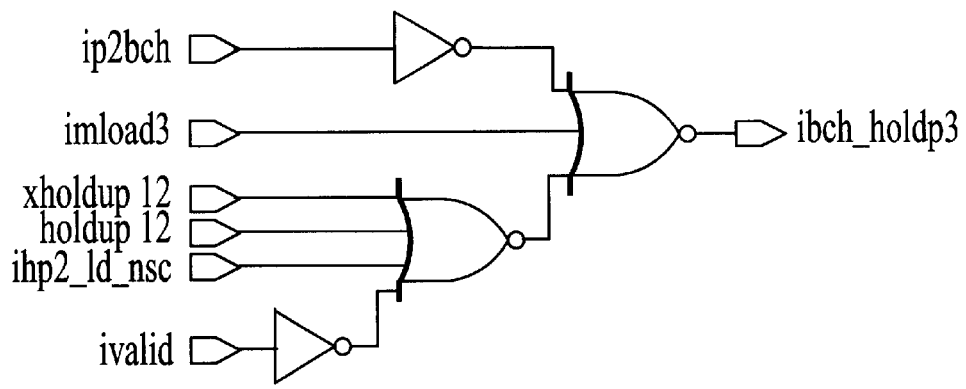
FIG. 4 is a schematic diagram illustrating a first embodiment of synthesized logic (unconstrained) used to implement the jump pipeline interlock methodology of FIG. 3.

FIG. 4 illustrates a first embodiment of synthesized logic used to implement the v5 jump pipeline interlock of the present invention. The logic of FIG. 4 was synthesized using the aforementioned Synopsys® Design Compiler using an LSI 10 k 10 um process with no constraints.

Figure 5:
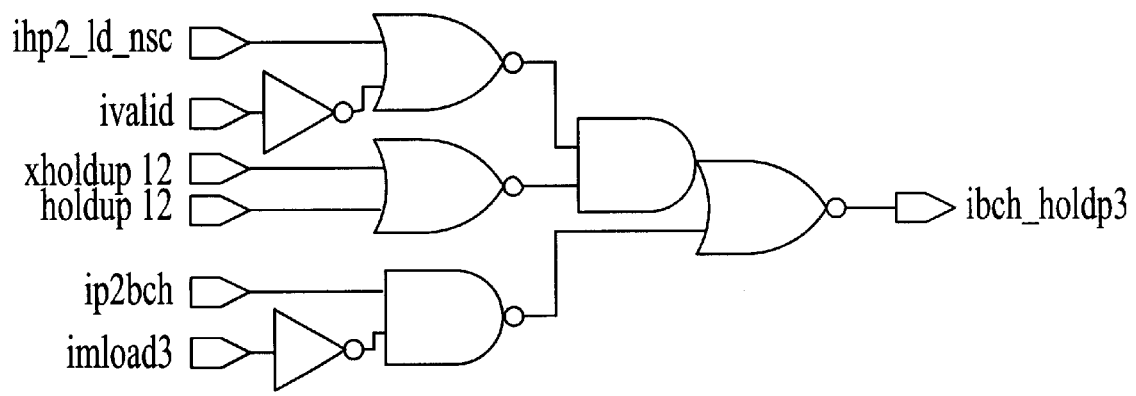
FIG. 5 is a schematic diagram illustrating a second embodiment of synthesized logic (constrained) used to implement the jump pipeline interlock methodology of FIG. 3.

FIG. 5 illustrating a second embodiment of the synthesized logic of the v5 jump pipeline interlock, except incorporating the constraint that the delay between ivalid and ibch_holdp3 is minimized. It will be recognized, however, that other constraints may be used in the alternative and/or in conjunction with the ivalid/ibch_holdp3 minimization constraint.

Figure 6:
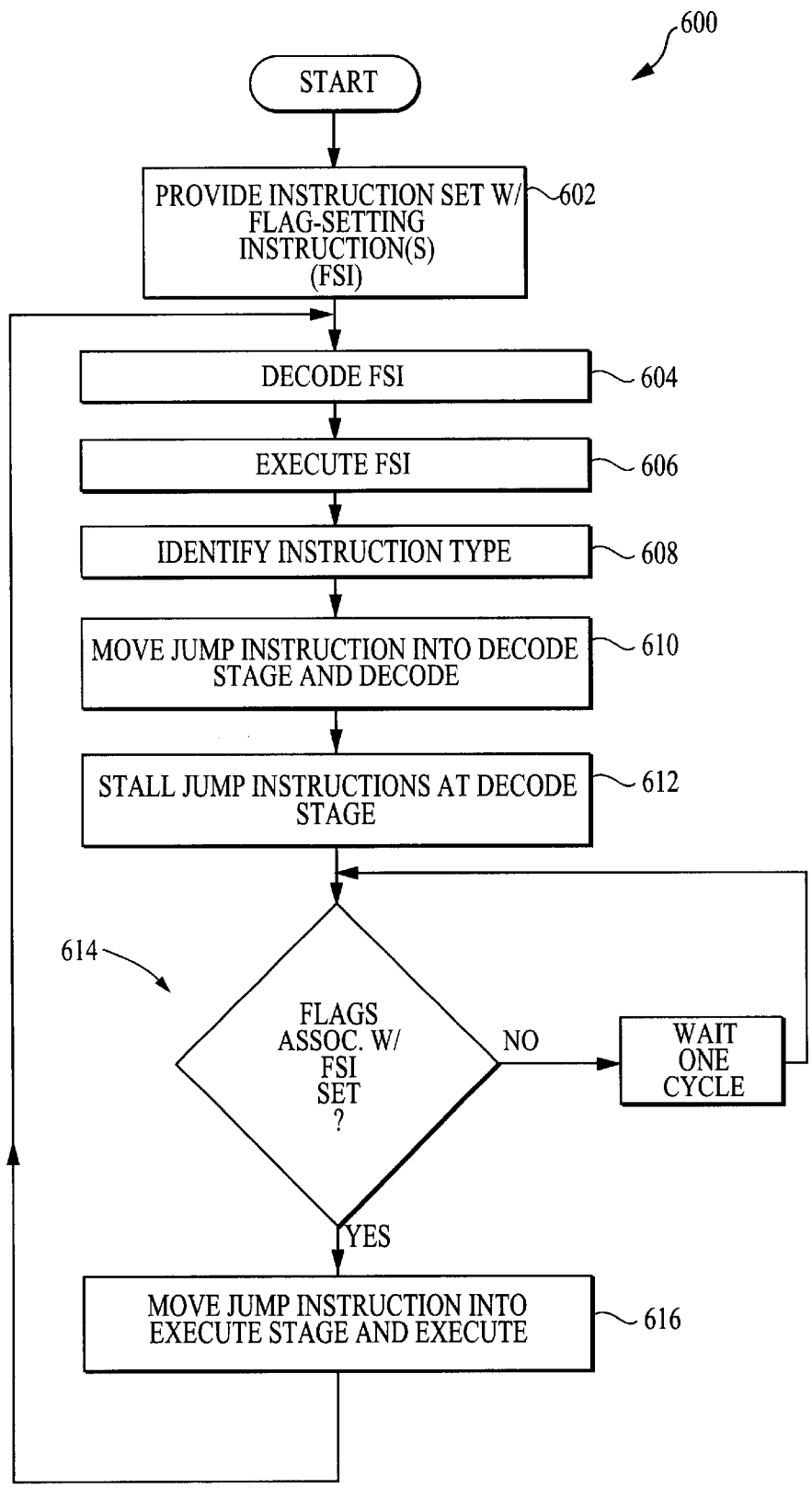
FIG. 6 is a logical flow diagram illustrating the generalized methodology of controlling branching within a pipelined processor via a second interlock mode according to the present invention.

Referring now to FIG. 6, a second embodiment of the generalized method of controlling jumping within a pipelined processor according to the present invention is described. In a first step 602 of the method 600, an instruction set adapted to run on the processor and comprising a plurality of instruction words is provided as previously described. At least one of the instruction words comprises a flag setting instruction (such as the "xor.f" instruction in the example above), and at least one other word comprises a jump instruction.

In contrast to the method of FIG. 3 herein, however, the interlock of the embodiment of FIG. 6 does not permit scheduling a NOP or flag setting instruction into the slot immediately preceding the jump. Rather, the processor first moves the flag setting instruction into the decode stage and decodes the instruction in step 604. Next, in step 606, the flag setting instruction is moved into the execution stage and executed. At this point, the identity of the instruction in the execution stage is determined (step 608); exemplary code useful for making this determination is described below with respect to Table 1. The jump instruction is moved into the decode stage and decoded per step 610. The jump instruction is stalled in the decode stage (step 612) until the flag setting instruction has moved out of the execution stage and the flags set accordingly per step 614. Note that the stall of step 612 only occurs if it is determined in step 608 that a flag setting operation is present. The jump instruction is then moved into the execution stage and executed in step 616. As will be readily appreciated, this approach allows, inter alia, a more compact code to be written for an "if-then" structure. Furthermore, it will be appreciated that many of the foregoing steps (such as movement of the flag setting instruction into the execution stage and movement of the jump instruction into the decode stage) may occur simultaneously.

The following exemplary code structure (relating to Version 6 or "v6" of the ARC Core) illustrates the methodology of FIG. 6:

```
v6 code:    xor.f    0,r0,-2          ; test if r0 is -2
            bz       r0_is_minus_2    ; take branch
```

The v6 interlock code structure above allows the NOP of the v5 code (FIG. 3 herein) to be omitted, since the branch at stage 2 will be delayed until the flag-setting instruction has moved out of stage 3 and the flags have been set. The v6 code takes the same time to execute as the v5 code, but a significant saving is made in code size, since many NOPs present in the v5 code are left out.

The following types of valid instructions must be detected and identified at stage 3 in order to enable the v6 interlock:
  i. Any ALU instruction which sets the flags (e.g., "p3setflags")
  ii. Flag setting jump instructions (e.g., Jcc.F or JLcc.F)*
  iii. A FLAG instruction These flag-setting jump instructions are used to return from subroutines or interrupts since they allow the 32-bit register which contains the program counter and processor flags to be reloaded simultaneously from a single saved 32-bit quantity in a register.

Detection of these instructions is accomplished in the present embodiment as illustrated in Table 1:

TABLE 1

| Code | Instruction Type Detected |
| --- | --- |
| ibch_p3flagset<=ip3iv WHEN (ip3setflags = '1') | ---ALU |
| OR ((ip3i = ojcc) AND (ip3_fbit = '1')) | ---Jcc/JLcc |
| OR ((ip3i = oflag) AND (ip3c = so_flag)) | ---FLAG |
| ELSE '0'; | |

Note that in order to generate the stall, detection of a valid branch instruction present in stage 2 (e.g., "ip2bch") is also required. Hence, a stall is generated when the two conditions are present together:

1. an instruction in stage 3 is attempting to set the flags; and
2. a branch instruction at stage 2 needs to use these new flags The following exemplary code structure is used in v6 to determine the truth of these two conditions:

TABLE 2

| Code | Instruction Type Detected |
| --- | --- |
| ibch_holdp2 <= '1' WHEN (ibch_p3flagset = '1') | --Stage 3 setting flags |
| AND (ip2bch = '1') | --Branch in Stage 2 |
| ELSE '0'; | |

Note that in the illustrated embodiment, it is also possible to detect the those program conditions in which either (a) the flags do not get set; or (b) the following branch instruction does not check the flags that are set. In both conditions, the link between setting the flags and the following branch is removed. Accordingly, detection of these conditions provides further potential improvements in processor performance since it would not be necessary to generate a stall for the flag set/branch combination if it could be detected that the flags would not be set (if the instruction is subsequently killed), or that the flags which would be set by the instruction are not tested by the branch condition chosen.

The following specific examples of the v6 code are illustrative of the foregoing concept:

i. Conditional flag set instruction at stage 3 does not set flags (e.g., add.cc.f r0,r0,r0, resulting in c=1)
ii. Branch at stage 2 uses the AL (always) condition code.

Appendix B hereto includes an exemplary jump pipeline interlock VHDL representation according to the present invention, as used for synthesis with Version 6 (v6) of the ARC Core. It will be recognized, however, that the foregoing methodology is not limited to this one specific application, but rather may be utilized in conjunction with any number of different processor designs.

Figure 7:
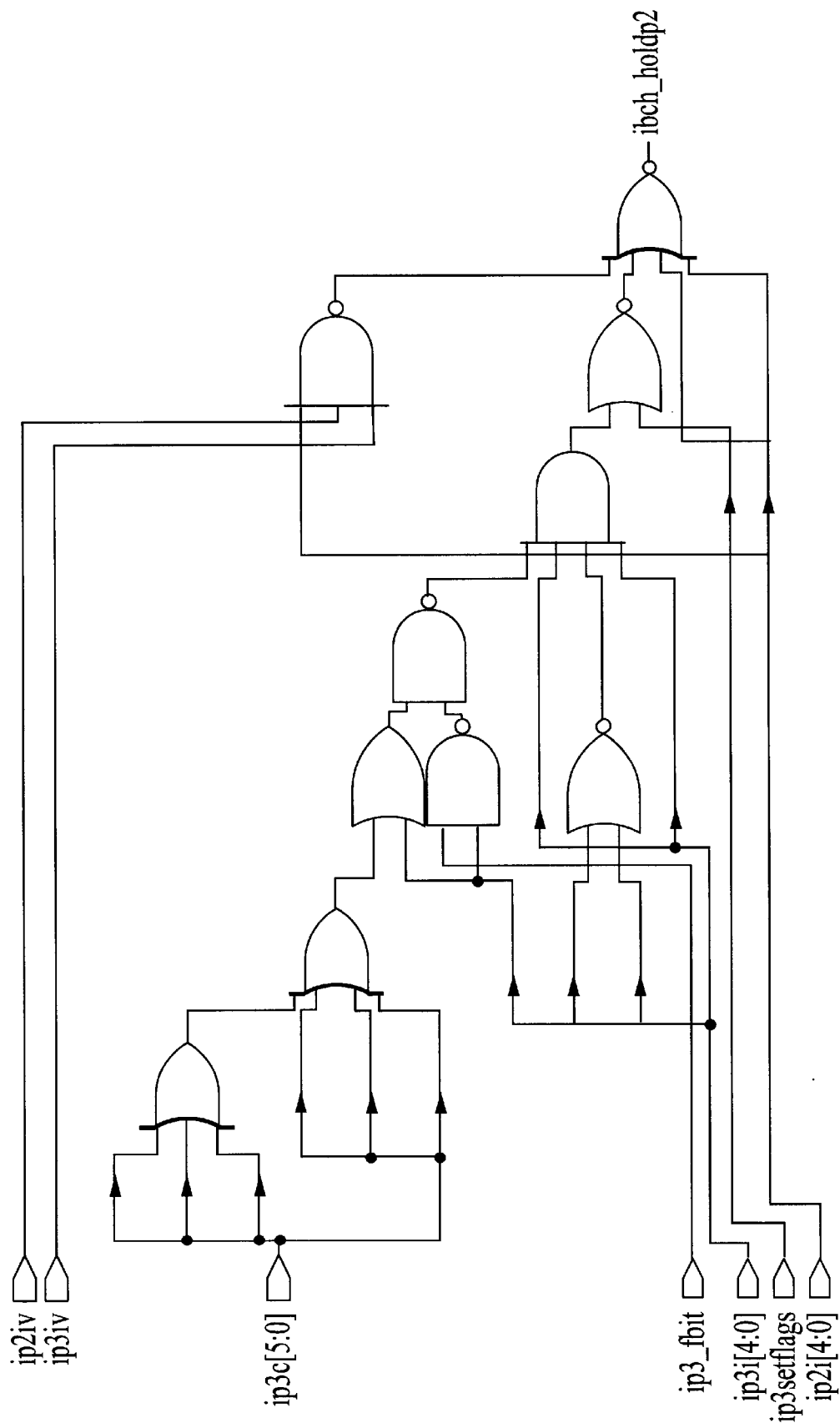
FIG. 7 is a schematic diagram illustrating a first embodiment of synthesized logic (unconstrained) used to implement the jump pipeline interlock methodology of FIG. 6.

FIG. 7 illustrates a first embodiment of synthesized logic used to implement the v6 jump pipeline interlock of the present invention. The logic of FIG. 7 was synthesized using the aforementioned Synopsys® Design Compiler using an LSI 10 k 1.0 um process with no constraints.

Figure 8:
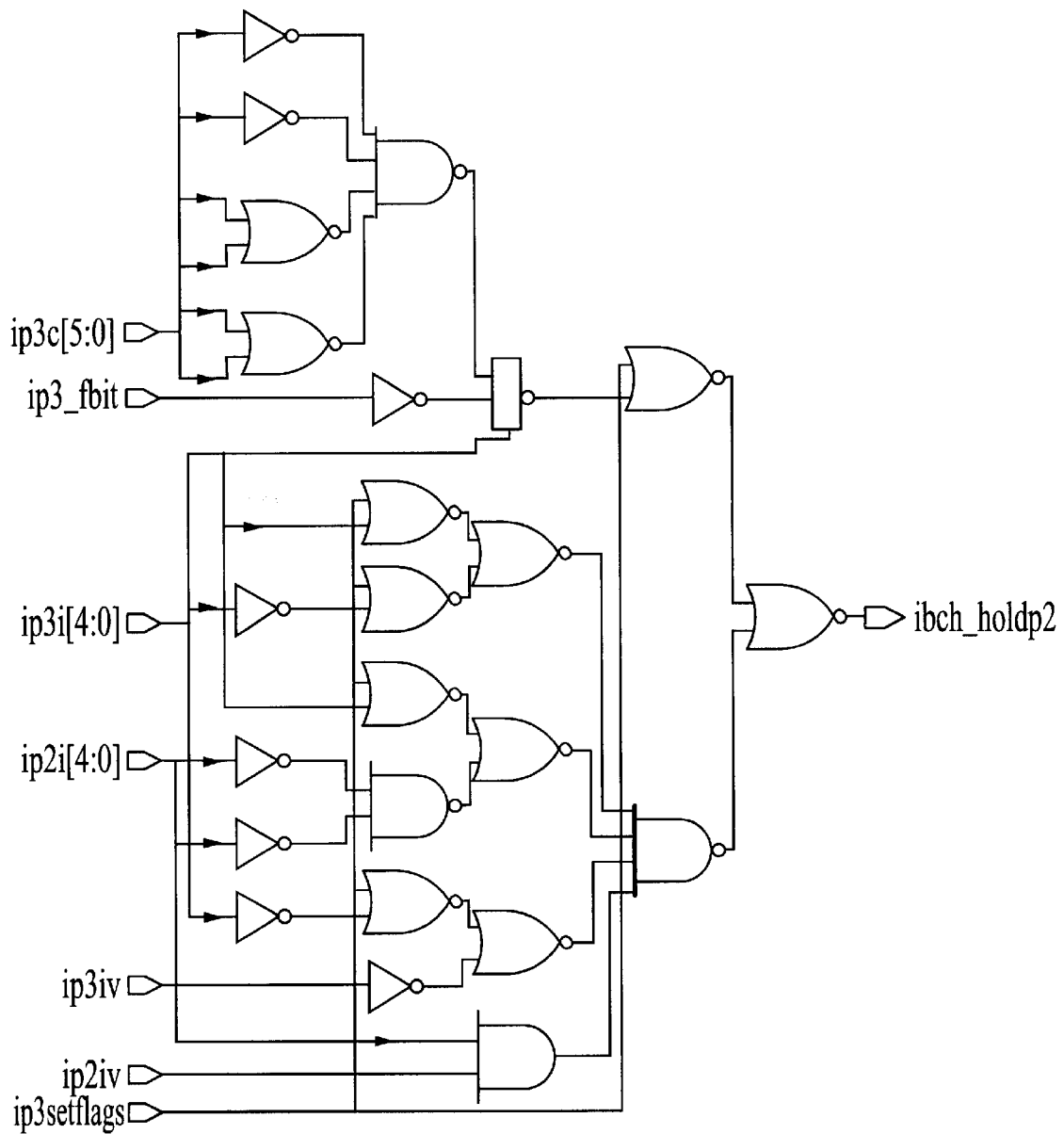
FIG. 8 is a schematic diagram illustrating a second embodiment of synthesized logic (constrained) used to implement the jump pipeline interlock methodology of FIG. 6.

FIG. 8 illustrates a second embodiment of the synthesized logic of the v6 jump pipeline interlock, except incorporating the constraint that the delay between the inputs and ibch_holdp3 is minimized. The logic of FIG. 8 was also synthesized using the aforementioned Synopsys® Design Compiler using an LSI 10 k 1.0 um process.

It will further be recognized that the jump pipeline interlock functionality as embodied in v5 or v6 (or other embodiments consistent with the present invention) may be integrated with other jump control or pipeline interlocking techniques. See for example, the jump delay slot modes described in Applicant's co-pending U.S. patent application entitled "Method And Apparatus For Jump Delay Slot Control In A Pipelined Processor," and the pipeline tearing and catch-up methods of Applicant's co-pending U.S. patent application entitled "Method and Apparatus for Processor Pipeline Segmentation and Re-Assembly," both filed contemporaneously herewith, and both which are incorporated by reference herein in their entirety. Furthermore, various register encoding schemes such as disclosed in Applicant's co-pending U.S. patent application entitled "Method and Apparatus for Loose Register Encoding Within a Pipelined Processor," filed contemporaneously herewith, and incorporated by reference in its entirety, may also be used in conjunction with the present invention.

Method of Synthesizing

Figure 9:
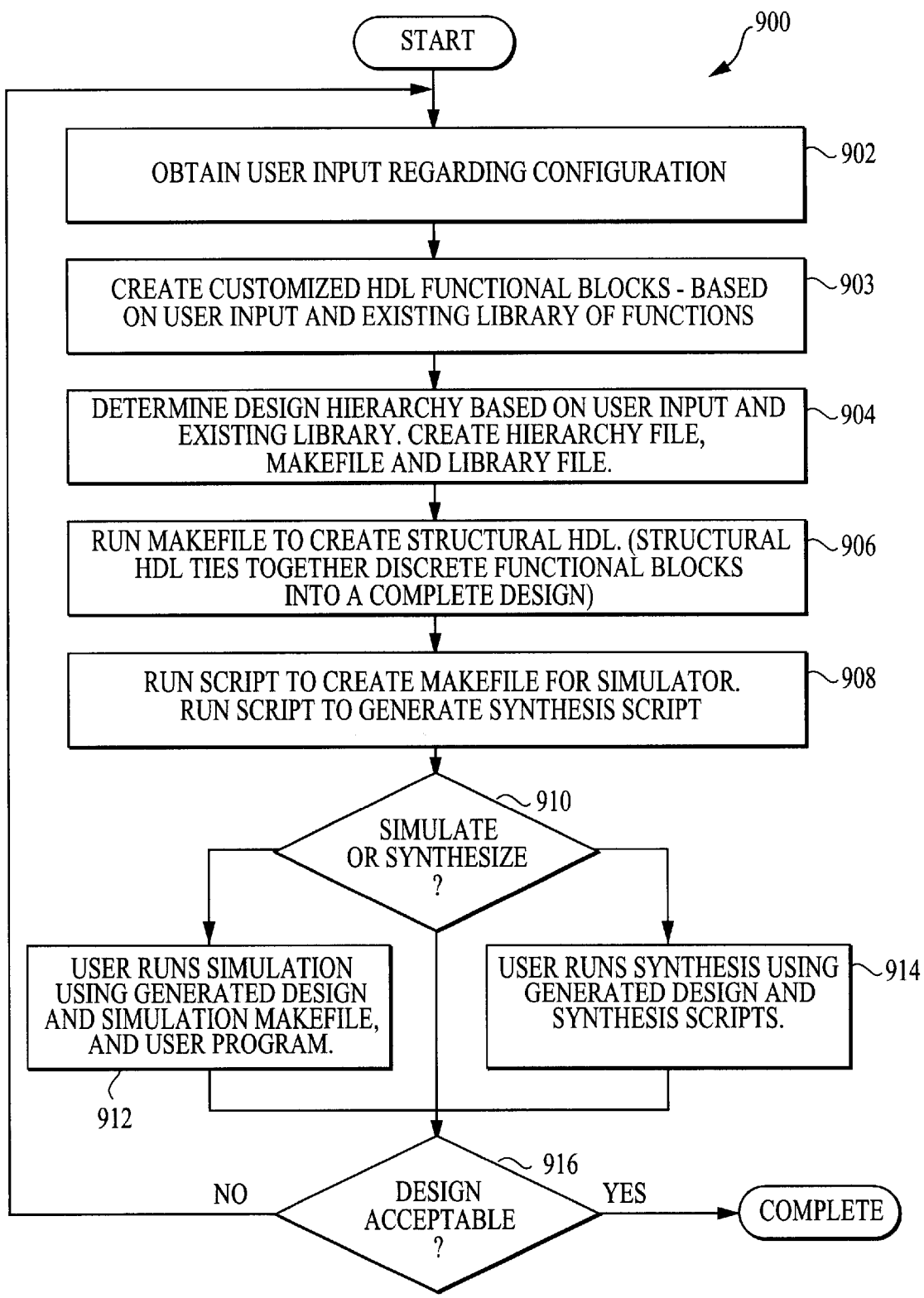
FIG. 9 is a logical flow diagram illustrating the generalized methodology of synthesizing processor logic which incorporates jump control interlocks according to the present invention.

Referring now to FIG. 9, the method 900 of synthesizing logic incorporating the jump pipeline interlock functionality previously discussed is described. The generalized method of synthesizing integrated circuit logic having a user-customized (i.e., "soft") instruction set is disclosed in Applicant's co-pending U.S. patent application Ser. No. 09/418,663 entitled "Method And Apparatus For Managing The Configuration And Functionality Of A Semiconductor Design" filed Oct. 14, 1999, which is incorporated herein by reference in its entirety.

While the following description is presented in terms of an algorithm or computer program running on a microcomputer or other similar processing device, it can be appreciated that other hardware environments (including minicomputers, workstations, networked computers, "supercomputers", and mainframes) may be used to practice the method. Additionally, one or more portions of the computer program may be embodied in hardware or firmware as opposed to software if desired, such alternate embodiments being well within the skill of the computer artisan.

Initially, user input is obtained regarding the design configuration in the first step 902. Specifically, desired modules or functions for the design are selected by the user, and instructions relating to the design are added, subtracted, or generated as necessary. For example, in signal processing applications, it is often advantageous for CPUs to include a single "multiply and accumulate" (MAC) instruction. In the present invention, the instruction set of the synthesized design is modified so as to incorporate the foregoing jump pipeline interlocks (or another comparable interlock/control architecture) therein. The technology library location for each VHDL file is also defined by the user in step 902. The technology library files in the present invention store all of the information related to cells necessary for the synthesis process, including for example logical function, input/output timing, and any associated constraints. In the present invention, each user can define his/her own library name and location(s), thereby adding further flexibility.

Next, in step 903, customized HDL functional blocks based on the user's input and the existing library of functions specified in step 902 are created.

In step 904, the design hierarchy is determined based on the user's input and the aforementioned library files. A hierarchy file, new library file, and makefile are subsequently generated based on the design hierarchy. The term "makefile" as used herein refers to the commonly used UNIX makefile function or similar function of a computer system well known to those of skill in the computer programming arts. The makefile function causes other programs or algorithms resident in the computer system to be executed in the specified order. In addition, it further specifies the names or locations of data files and other information necessary to the successful operation of the specified programs. It is noted, however, that the invention disclosed herein may utilize file structures other than the "makefile" type to produce the desired functionality.

In one embodiment of the makefile generation process of the present invention, the user is interactively asked via display prompts to input information relating to the desired design such as the type of "build" (e.g., overall device or system configuration), width of the external memory system data bus, different types of extensions, cache type/size, etc. Many other configurations and sources of input information may be used, however, consistent with the invention.

In step 906, the makefile generated in step 904 is run to create the structural HDL. This structural HDL ties the discrete functional block in the design together so as to make a complete design.

Next, in step 908, the script generated in step 906 is run to create a makefile for the simulator. The script to generate a synthesis script is also run in step 908.

At this point in the program, a decision is made whether to synthesize or simulate the design (step 910). If simulation is chosen, the user runs the simulation using the generated design and simulation makefile (and user program) in step 912. Alternatively, if synthesis is chosen, the user runs the synthesis using the synthesis script(s) and generated design in step 914. After completion of the synthesis/simulation scripts, the adequacy of the design is evaluated in step 916. For example, a synthesis engine may create a specific physical layout of the design that meets the performance criteria of the overall design process yet does not meet the die size requirements. In this case, the designer will make changes to the control files, libraries, or other elements that can affect the die size. The resulting set of design information is then used to re-run the synthesis script.

If the generated design is acceptable, the design process is completed. If the design is not acceptable, the process steps beginning with step 902 are re-performed until an acceptable design is achieved. In this fashion, the method 900 is iterative.

Figure 10:
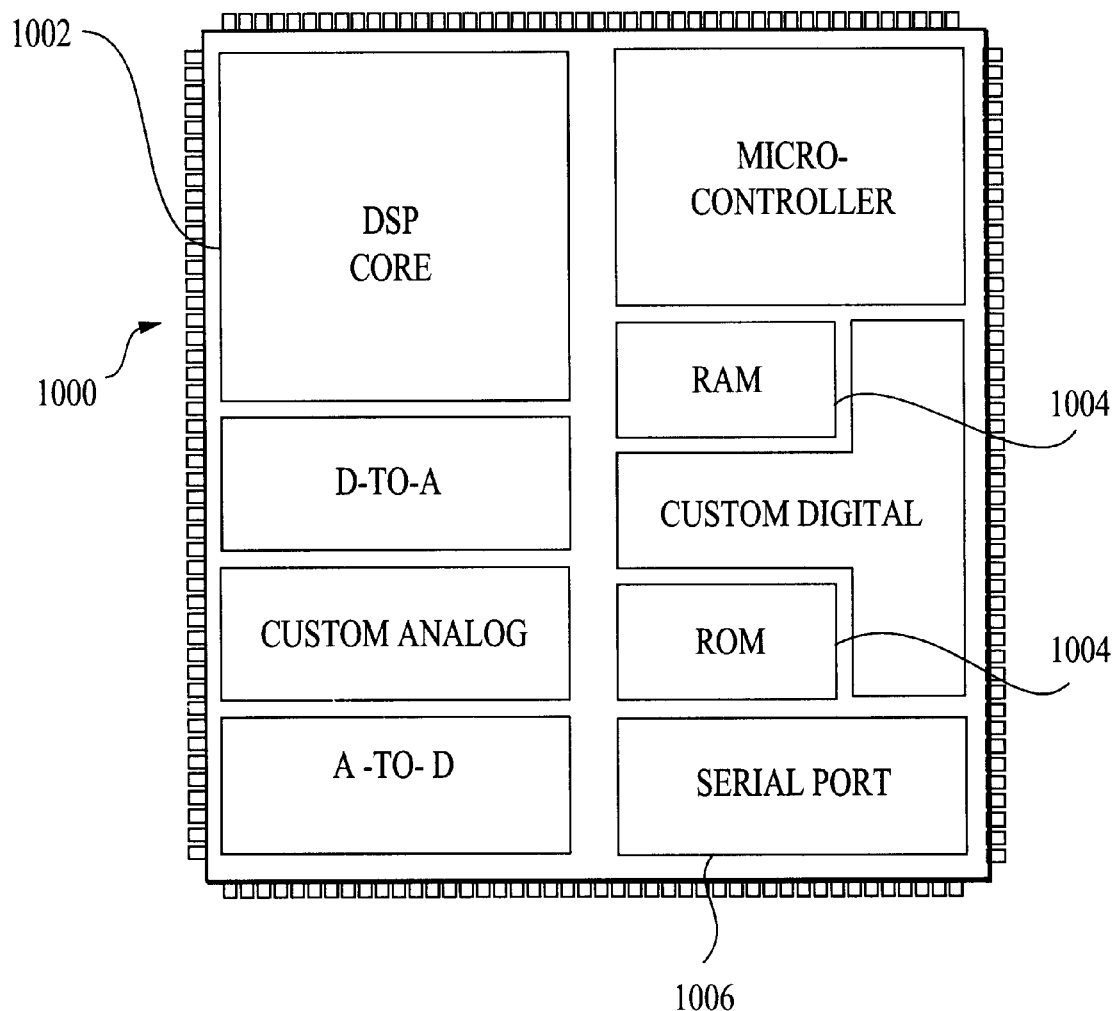
FIG. 10 is a block diagram of a processor design incorporating pipeline interlocking according to the present invention.

FIG. 10 illustrates an exemplary pipelined processor fabricated using a 1.0 um process and incorporating the logic of FIGS. 4, 5, 7 or 8 and the jump pipeline interlock functionality previously described herein. As shown in FIG. 10, the processor 1000 is an ARC microprocessor-like CPU device having, inter alia, a processor core 1002, on-chip memory 1004, and an external interface 1006. The device is fabricated using the customized VHDL design obtained using the method 900 of the present invention, which is subsequently synthesized into a logic level representation, and then reduced to a physical device using compilation, layout and fabrication techniques well known in the semiconductor arts.

It will be appreciated by one skilled in the art that the processor of FIG. 10 may contain any commonly available peripheral such as serial communications devices, parallel ports, timers, counters, high current drivers, analog to digital (A/D) converters, digital to analog converters (D/A), interrupt processors, LCD drivers, memories and other similar devices. Further, the processor may also include custom or application specific circuitry. The present invention is not limited to the type, number or complexity of peripherals and other circuitry that may be combined using the method and apparatus. Rather, any limitations are imposed by the physical capacity of the extant semiconductor processes which improve over time. Therefore it is anticipated that the complexity and degree of integration possible employing the present invention will further increase as semiconductor processes improve.

It is also noted that many IC designs currently use a microprocessor core and a DSP core. The DSP however, might only be required for a limited number of DSP functions, or for the IC's fast DMA architecture. The invention disclosed herein can support many DSP instruction functions, and its fast local RAM system gives immediate access to data. Appreciable cost savings may be realized by using the methods disclosed herein for both the CPU & DSP functions of the IC.

Additionally, it will be noted that the methodology (and associated computer program) as previously described herein can readily be adapted to newer manufacturing technologies, such as 0.35, 0.18 or 0.1 micron processes, with a comparatively simple re-synthesis instead of the lengthy and expensive process typically required to adapt such technologies using "hard" macro prior art systems.

Figure 11:
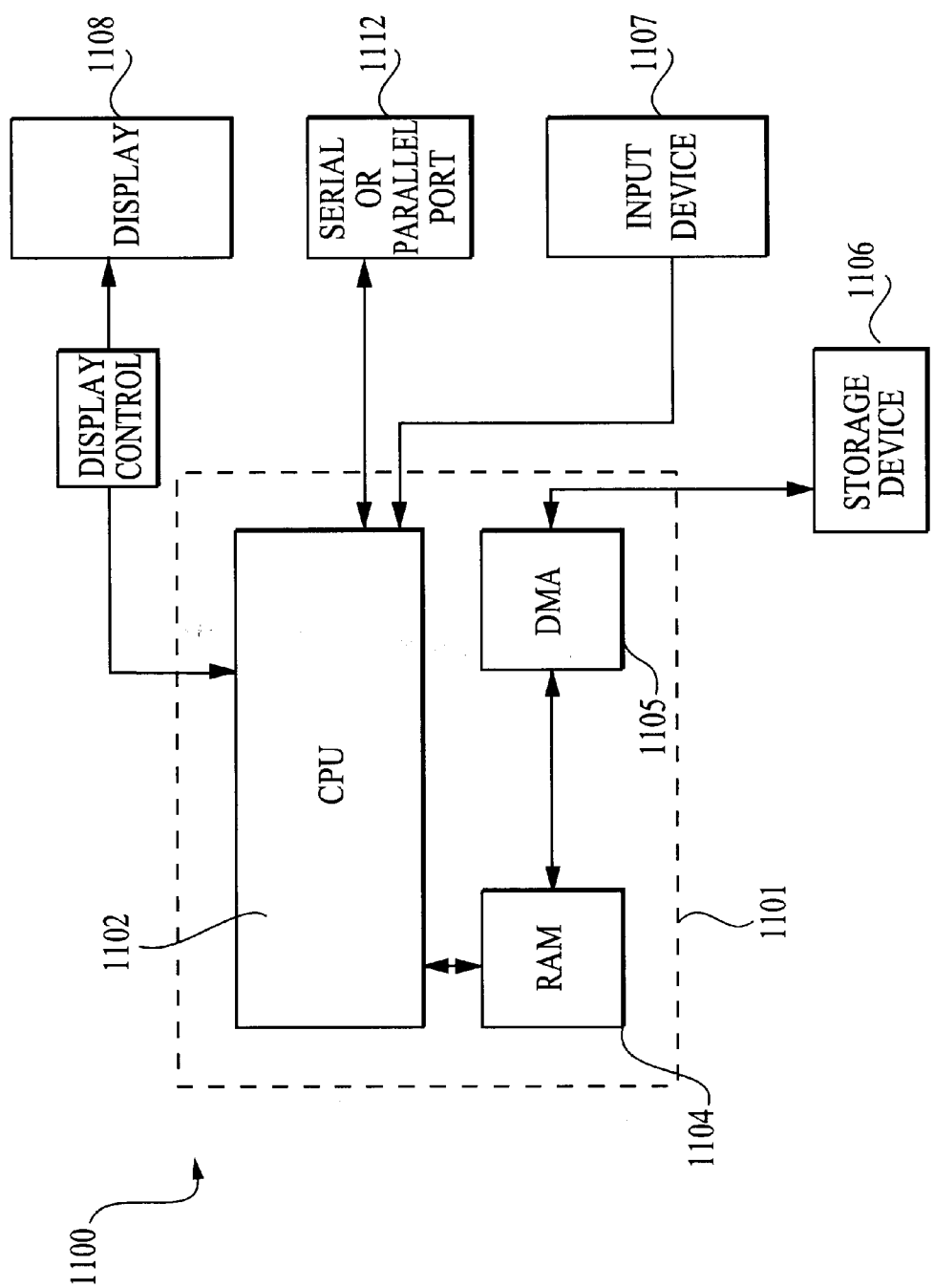
FIG. 11 is a functional block diagram of a computing device incorporating the hardware description language of the present invention, used to synthesize the logic apparatus of FIGS. 4–5 and 7–8.

Referring now to FIG. 11, one embodiment of a computing device capable of synthesizing, inter alia, the jump pipeline interlock logic structures of FIGS. 4–5 and 7–8 herein is described. The computing device 1100 comprises a motherboard 1101 having a central processing unit (CPU) 1102, random access memory (RAM) 1104, and memory controller 1105. A storage device 1106 (such as a hard disk drive or CD-ROM), input device 1107 (such as a keyboard or mouse), and display device 1108 (such as a CRT, plasma, or TFT display), as well as buses necessary to support the operation of the host and peripheral components, are also provided. The aforementioned VHDL descriptions and synthesis engine are stored in the form of an object code representation of a computer program in the RAM 1104 and/or storage device 1106 for use by the CPU 1102 during design synthesis, the latter being well known in the computing arts. The user (not shown) synthesizes logic designs by inputting design configuration specifications into the synthesis program via the program displays and the input device 1107 during system operation. Synthesized designs generated by the program are stored in the storage device 1106 for later retrieval, displayed on the graphic display device 1108, or output to an external device such as a printer, data storage unit, other peripheral component via a serial or parallel port 1112 if desired.

While the above detailed description has shown, described, and pointed out novel features of the invention as applied to various embodiments, it will be understood that various omissions, substitutions, and changes in the form and details of the device or process illustrated may be made by those skilled in the art without departing from the invention. The foregoing description is of the best mode presently contemplated of carrying out the invention. This description is in no way meant to be limiting, but rather should be taken as illustrative of the general principles of the invention. The scope of the invention should be determined with reference to the claims.

APPENDIX A

EXEMPLARY JUMP PIPELINE VHDL USED FOR SYNTHESIS (v5)
© 1999 ARC International plc. All rights reserved.

```
library ieee;
use ieee.std_logic_1164.all;
entity jump_pipe_v5 is
PORT(    ip2bch         ;    in    std_ulogic;
         imload3        ;    in    std_ulogic;
         holdup12       ;    in    std_ulogic;
         ihp2_ld_nsc    ;    in    std_ulogic;
         xholdup12      ;    in    std_ulogic;
         ivalid         ;    in    std_ulogic;
         ibch_holdp3    ;    out   std_ulogic;
end jump_pipe_v5;
architecture synthesis of jump_pipe_v5 is
begin
    ibch_holdp3  <=  '1'    WHEN ip2bch = '1'
                            AND imload3 = '0'
                            AND ( (holdup12
                                OR ihp2_ld_nsc) = '1'
                                OR xholdup12 = '1'
                                OR ivalid = '0'  ) ELSE
                            '0';
end synthesis;
```

APPENDIX B

EXEMPLARY JUMP PIPELINE VHDL USED FOR SYNTHESIS (v6)

```
© 1999 ARC International plc. All rights reserved.
library ieee.arc;
use ieee.std_logic_1164.all;
use arc.arcutil.all;
entity jump_pipe_v6 is
PORT( ip2iv          ;   in    std_ulogic;
      ip3iv          ;   in    std_ulogic;
      ip3setflags    ;   in    std_ulogic;
      ip2i           ;   in    std_ulogic_vector(4 downto 0);
      ip3i           ;   in    std_ulogic_vector(4 downto 0);
      ip3c           ;   in    std_ulogic_vector(5 downto 0);
      ip3_fbit       ;   in    std_ulogic);
      ibch_holdp2 ;      out   std_ulogic);
end jump_pipe_v6;
architecture synthesis of jump_pipe_v6 is
    signal   bch_p3flagset       ;    std_ulogic;
    signal   p2bch               ;    std_ulogic;
begin
-- Detect branch in stage 2
    ip2bch <= '1' WHEN ip2iv = '1'  AND  (ip2i = obcc OR ip2i = oblcc
                                    OR    ip2i = olpcc
                                    OR    ip2i = ojcc ) ELSE
                                    '0';
-------------------- ibch_holdp2    :   Branch protection system --------------------
--
-- --
-- In order to reduce code size, we want to remove the need to have a NOP
-- between setting the flags and taking the associated branch.
--
-- e.g.    sub.f      0, r0, 23       ; is r0=23?
--         nop                         ; padding instruction. <<--
--         bz         r0_is_23        ;
--
-- In order that the compiler does not have to generate these instructions,
-- we can generate a stage 2 stall if an instruction in stage 3 is attempting
-- to set the flags. Once this instruction has completed, and has passed out
-- of stage 3, then stage 2 will continue.
--
-- We need to detect the following types of valid instruction at stage 3;
--
-- i.    Any ALU instruction which sets the flags (p3setflags)
-- ii.   Jcc.F or JLcc.F
-- iii.  A FLAG instruction
--
    ibch_p3flagset<=   ip3iv  WHEN (ip3setflags = '1')                   --ALU
                              OR ((ip3i = ojcc) AND (ip3_fbit = '1'))    --Jcc/JLcc
                              OR ((ip3i = oflag) AND (ip3c = so_flag))   --Flag
        ELSE  '0';
-- In order to generate the stall, we also need to detect a valid branch instruction
-- present in stage 2 (ip2bch).
```

APPENDIX B-continued

EXEMPLARY JUMP PIPELINE VHDL USED FOR SYNTHESIS (v6)

```
-- We generate a stall when the two conditions are present together:
--
--   a.   An instruction in stage 3 is attempting to set the flags
--   b.   A branch instruction at stage 2 needs to use these new flags
--
--
-- Both of the following cases remove the link between setting the flags and the
following branch, either because the flags don't get set, or because the branch doesn't
-- check the flags.
--
--   i.   Conditional flag set instruction at stage 3 does not set flags
--        e.g., add.cc.f r0, r0, r0, resulting in c=1
--
--   ii.  Branch at stage 2 uses the AL (always) condition code.
--
        ibch_holdp2 <=   '1'   WHEN (ibch_p3flagset = '1')         -- p3 setting flags
                               AND (ip2bch = '1')          ELSE -- branch in p2
                         '0';
end synthesis;
```

What is claimed is:

1. A method of controlling program jumping within a processor having a pipeline comprising at least fetch, decode, and execute stages, the method comprising:

providing a program comprising a plurality of instruction words, at least one of said words comprising a flag setting instruction, and at least one other of said instruction words comprising a jump instruction which follows said at least one flag setting within said pipeline;

moving said at least one flag setting instruction into said execute state;

moving said at least one jump instruction into said decode stage;

detecting at least one instance when one or more flags set by said at least one flag setting instruction will affect a subsequent execution of said at least one jump instruction; and stalling the movement of said at least one jump instruction from said decode stage at least until said at least one flag setting instruction has completed executing, and all flags to be set thereby have been set.

2. A digital processor comprising:

a processor core having a multistage instruction pipeline, said core being adapted to decode and execute an instruction set comprising a plurality of instruction words, said core further being adapted to (i) stall an instruction in a first stage of said pipeline and process an instruction within a second, subsequent stage of said pipeline after said first stage has stalled; (ii) move the processed instruction within said second stage to a third stage; and (iii) insert a blank slot into said second stage of said pipeline to prevent the processed instruction present in said second stage from being executed multiple times;

a data interface between said processor core and an information storage device; and an instruction set comprising a plurality of instruction words, least one of said words comprising a flag setting instruction, and at least one other of said instruction words comprising a jump instruction which follows said at least one flag setting instruction within said pipeline, said processor further being adapted to detect at least one instance when one or more flags set by said at least one flag setting instruction will affect a subsequent execution of said at least one jump instruction, and stall the execution of said at least one jump instruction within said pipeline at least until all flags to be set by said at least one flag setting instruction have been set.

3. The processor of claim 2, wherein said multistage pipeline comprises an at least four stage pipeline comprising instruction fetch, decode, execute and writeback stages.

4. The processor of claim 2, wherein said at least one flag setting instruction sets a plurality of flags within an arithmetic logic unit (ALU) of said processor.

5. A digital processor core having a pipeline and adapted to decode and execute an instruction set comprising a plurality of instruction words, said core further being adapted to (i) stall and process first and second instructions in first and second stages of said pipeline, respectively: (ii) move the processed instruction within said second stage to a third stage; and (iii) insert a blank slot into said second stage of said pipeline to prevent duplicative processing of said second instruction; and wherein a flag setting instruction, and a jump instruction following said at least one flag setting instruction, are disposed within said pipeline, said processor core further being adapted to detect at least one instance when at least one flag set by said at least one flag setting instruction conditionally affects a subsequent execution of said at least one jump instruction, and stall the execution of said at least one jump instruction within said pipeline at least until said at least one flag has been set.

6. A processor core having a pipeline and adapted to decode and execute an instruction set comprising a plurality of instruction words, said core further being adapted to:

stall an instruction in a first stage of said pipeline;

process an instruction in a second stage; and fill said second stage after moving the processed instruction to a third stage; and wherein a flag setting instruction, and a jump instruction which follows said at least one flag setting instruction, are disposed within said pipeline, said processor core further being adapted to:

detect at least one instance when at least one flag set by said at least one flag setting instruction affects a subsequent execution of said at least one jump instruction; and stall the execution of said at least one jump instruction within said pipeline at least until said at least one flag has been set.

7. The processor core of claim 6, wherein said act of filling said second stage comprises inserting a blank slot into said second stage.

8. The processor core of claim 6, wherein said act of filling said second stage comprises inserting an instruction into said second stage.

9. A processor core having a pipeline and adapted to decode and execute an instruction set comprising a plurality of instruction words, said core further comprising:

means for stalling an instruction in a first stage of said pipeline;

means for processing an instruction in a second stage; and means for filling said second stage after moving the processed instruction to a third stage; and wherein a flag setting instruction, and a jump instruction which follows said at least one flag setting instruction, are disposed within said pipeline, said processor core further comprising:

means for detecting at least one instance when at least one flag set by said at least one flag setting instruction will affect a subsequent execution of said at least one jump instruction; and means for stalling the execution of said at least one jump instruction within said pipeline at least until said at least one flag has been set.

10. A processor core having a pipeline and adapted to execute an instruction set comprising a plurality of instruction words according to the method comprising:

stalling an instruction in a first stage of said pipeline;

processing an instruction in a second stage; and filling said second stage after moving the processed instruction to a third stage; and wherein a flag setting instruction, and a jump instruction which follows said at least one flag setting instruction, are disposed within said pipeline, said processor core further performing the steps of:

detecting at least one instance when at least one flag set by said at least one flag setting instruction can affect a subsequent execution of said at least one jump instruction; and stalling the execution of said at least one jump instruction within said pipeline at least until said at least one flag has been set.

* * * * *

UNITED STATES PATENT AND TRADEMARK OFFICE
CERTIFICATE OF CORRECTION

PATENT NO. : 6,560,754 B1
DATED : May 6, 2003
INVENTOR(S) : James Robert Howard Hakewill et al.

It is certified that error appears in the above-identified patent and that said Letters Patent is hereby corrected as shown below:

<u>Title page,</u>
Item [75] Inventors: James Robert Howard Hakewill, Herts (GB);
John Sanders, Middlesex (GB)" should read
-- [75] Inventors: James Robert Howard Hakewill, Herts (GB);
Jonathan Paul Sanders, Middlesex (GB) --

Signed and Sealed this

Twentieth Day of January, 2004

JON W. DUDAS
*Acting Director of the United States Patent and Trademark Office*